(12) United States Patent
Chang et al.

(10) Patent No.: US 11,658,204 B2
(45) Date of Patent: May 23, 2023

(54) MICROLED DISPLAY WITH PIXELATED SENSORS

(71) Applicant: GM GLOBAL TECHNOLOGY OPERATIONS LLC, Detroit, MI (US)

(72) Inventors: Kai-Han Chang, Madison Heights, MI (US); Thomas A. Seder, Fraser, MI (US); James A. Carpenter, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 284 days.

(21) Appl. No.: 17/095,874

(22) Filed: Nov. 12, 2020

(65) Prior Publication Data

US 2022/0149109 A1     May 12, 2022

(51) Int. Cl.
| | | |
|---|---|---|
| *H01L 27/15* | (2006.01) | |
| *H01L 33/62* | (2010.01) | |
| *G06F 3/044* | (2006.01) | |
| *G06F 3/041* | (2006.01) | |

(52) U.S. Cl.
CPC .......... *H01L 27/156* (2013.01); *G06F 3/044* (2013.01); *G06F 3/0412* (2013.01); *H01L 33/62* (2013.01)

(58) Field of Classification Search
CPC ..... H01L 27/156; H01L 33/62; H01L 25/167; H01L 3/32; G06F 3/0412; G06F 3/044; G06F 3/04166; G06F 3/0421; G09F 9/33; G09F 3/32
See application file for complete search history.

(56) References Cited

U.S. PATENT DOCUMENTS

| | | | | |
|---|---|---|---|---|
| 2010/0220269 A1* | 9/2010 | Takama | ................ | G06F 3/0421 430/321 |
| 2010/0315382 A1* | 12/2010 | Kurihara | ............... | G06F 3/0412 345/87 |
| 2017/0161544 A1* | 6/2017 | Fomani | ............. | G02F 1/133512 |
| 2019/0033976 A1* | 1/2019 | Cao | ....................... | G06F 3/0412 |
| 2019/0102016 A1* | 4/2019 | Kim | .................. | G02F 1/133602 |
| 2019/0114458 A1* | 4/2019 | Cho | .................... | G06V 40/1318 |
| 2020/0133414 A1* | 4/2020 | Lee | ......................... | G06F 3/044 |
| 2020/0380236 A1* | 12/2020 | He | ....................... | G06V 40/1318 |
| 2021/0020810 A1* | 1/2021 | Lius | ....................... | G06F 21/32 |
| 2021/0224503 A1* | 7/2021 | Cheng | ..................... | G09G 5/10 |
| 2021/0232841 A1* | 7/2021 | Wang | ................. | G02F 1/133514 |

\* cited by examiner

*Primary Examiner* — Victor A Mandala

(57) ABSTRACT

A display comprises a substrate. Sets of light emitting diodes (LEDs) are arranged on the substrate. Each of the sets of LEDs comprises a red LED, a green LED, a blue LED, and each of the sets of LEDs forming a pixel of the display. A sensor is embedded in each of the sets of LEDs. The sensor is arranged in a plane in which the red, green, and blue LEDs are arranged in each of the sets of LEDs. A cover including a dielectric material covers the sets of LEDs. The sensor is configured to sense at least one of ambient light and proximity of an object to the cover.

19 Claims, 8 Drawing Sheets

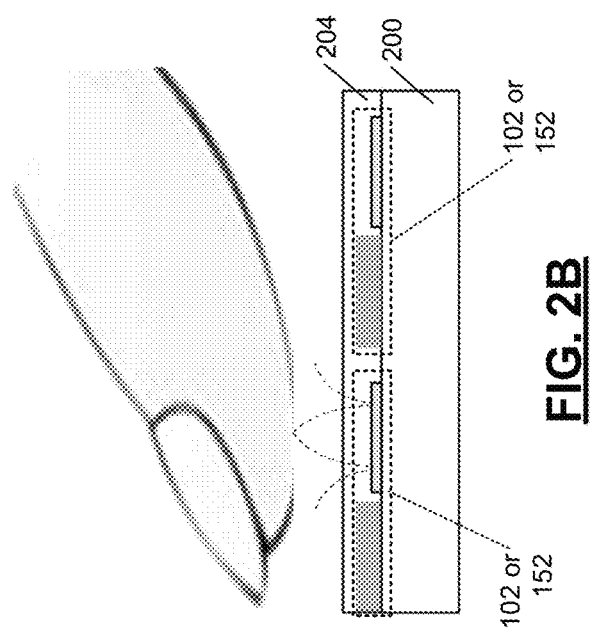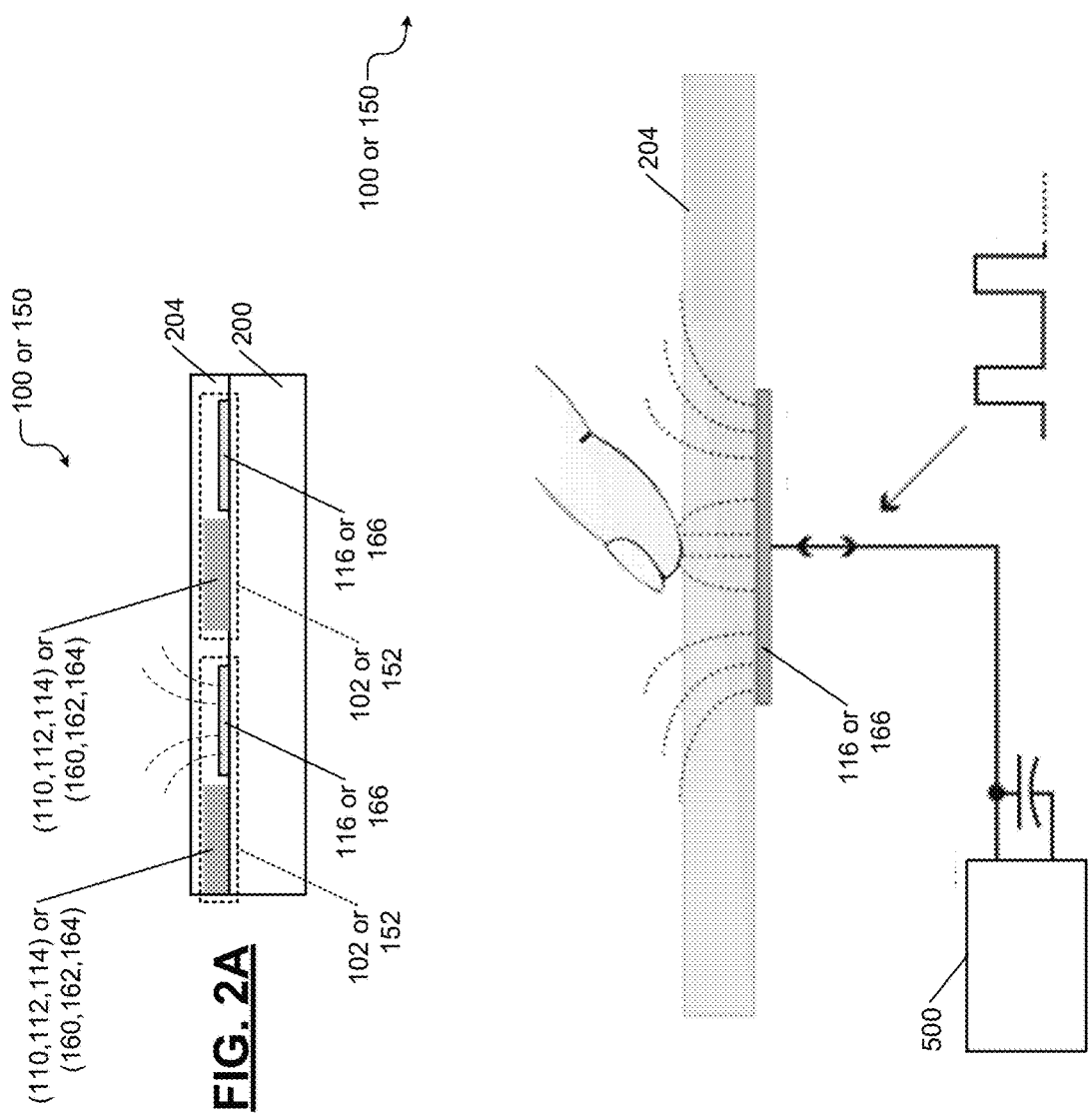

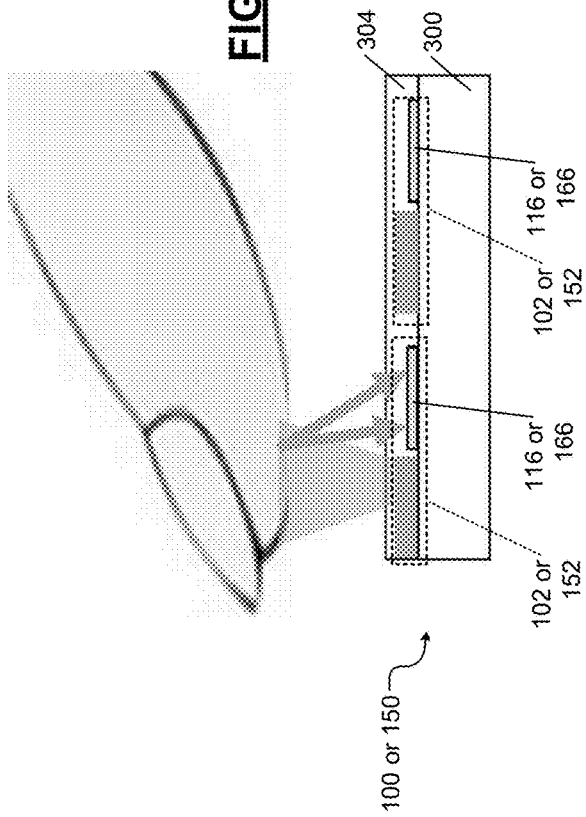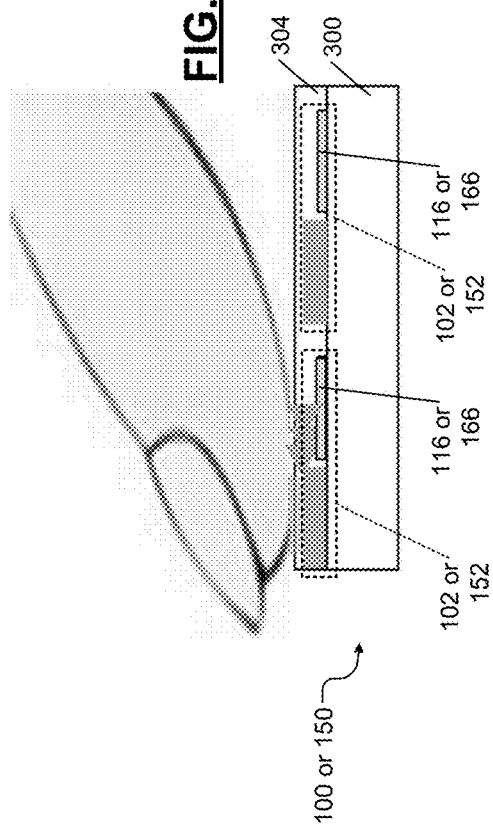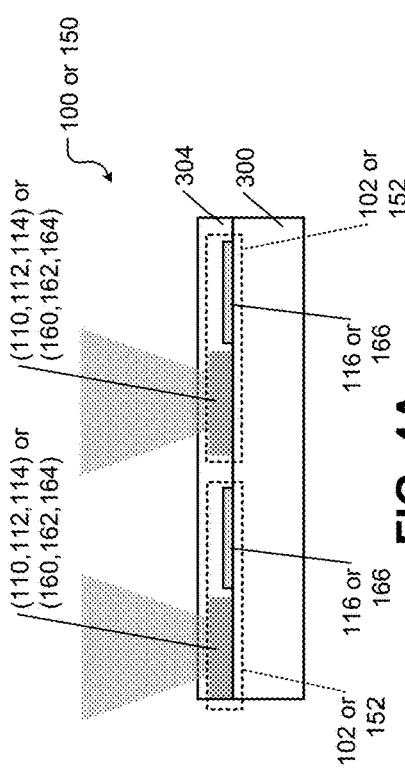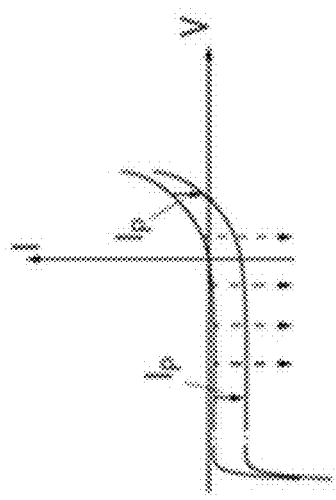

MICROLED DISPLAY WITH PIXELATED SENSORS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates generally to light emitting diode (LED)-based displays and more particularly to micro-LED displays with pixelated sensors.

Light emitting diode (LED)-based displays are used in various applications. For example, the LED-based displays are used in computers, mobile devices, televisions, kiosks, teller machines, household appliances, and vehicle dashboards. Many of these LED-based displays include touchscreens. Some devices such as computers and mobile devices can sense ambient light and can adjust intensity of these LED-based displays according to ambient light.

SUMMARY

A display comprises a substrate. Sets of light emitting diodes (LEDs) are arranged on the substrate. Each of the sets of LEDs comprises a red LED, a green LED, a blue LED, and each of the sets of LEDs forming a pixel of the display. A sensor is embedded in each of the sets of LEDs. The sensor is arranged in a plane in which the red, green, and blue LEDs are arranged in each of the sets of LEDs. A cover comprising a dielectric material covers the sets of LEDs. The sensor is configured to sense at least one of ambient light and proximity of an object to the cover.

In another feature, the sensor is configured to sense contact between the object and the cover.

In another feature, the sensor includes a capacitive sensor.

In another feature, the sensor includes a photo-resistor.

In another feature, the sensor includes a photo diode.

In another feature, in each pixel of the display, an area covered by the sensor is the same as an area covered by each of the red, green, and blue LEDs.

In another feature, in each pixel of the display, an area covered by the sensor is more than 3 times larger than an area covered by the red, green, and blue LEDs.

In another feature, a system comprises the display and a controller configured to control the sets of LEDs and to detect, based on an input received from the sensor, the at least one of ambient light and proximity of the object to the cover.

In another feature, a system comprises the display. The sensor includes a photodiode. The system comprises a controller configured to control the sets of LEDs, detect the proximity of the object to the cover based on an AC portion of an input received from the sensor, and detect the ambient light based on a DC portion of the input received from the sensor.

In another feature, a system comprises the display and a controller configured to detect, based on an input received from the sensor, the at least one of ambient light and proximity of the object to the cover; and to control one or more of the sets of LEDs based on the detected at least one of ambient light and proximity of the object to the cover.

In still other features, a method comprises arranging sets of light emitting diodes (LEDs) on a substrate. Each of the sets of LEDs comprises a red LED, a green LED, a blue LED, and each of the sets of LEDs forming a pixel of the display. The method comprises integrating a sensor in each of the sets of LEDs, the sensor being arranged in a plane in which the red, green, and blue LEDs are arranged in each of the sets of LEDs. The method comprises covering the sets of LEDs a cover comprising a dielectric material. The method comprises sensing using the sensor at least one of ambient light and proximity of an object to the cover.

In another feature, the method further comprises sensing using the sensor contact between the object and the cover.

In another feature, the sensor includes a capacitive sensor.

In another feature, the sensor includes a photo-resistor.

In another feature, the sensor includes a photo diode.

In another feature, in each pixel of the display, an area covered by the sensor is the same as an area covered by each of the red, green, and blue LEDs.

In another feature, in each pixel of the display, an area covered by the sensor is more than 3 times larger than an area covered by the red, green, and blue LEDs.

In another feature, the method further comprises detecting, based on an input received from the sensor, the at least one of ambient light and proximity of the object to the cover; and controlling one or more of the sets of LEDs based on the detected at least one of ambient light and proximity of the object to the cover.

In another feature, the sensor includes a photodiode, and the method further comprises detecting the proximity of the object to the cover based on an AC portion of an input received from the sensor; detecting intensity of the ambient light based on a DC portion of the input received from the sensor; and controlling the sets of LEDs based on one or more of the detected proximity of the object to the cover and the detected intensity of the ambient light.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A-2C show an example of a capacitive sensor embedded in the micro-LEDs of the micro-LED displays of FIGS. 1A and 1B according to the present disclosure;

FIGS. 4A-4D show an example of a photodiode sensor embedded in the micro-LEDs of the micro-LED displays of FIGS. 1A and 1B according to the present disclosure;

In the drawings, reference numbers may be reused to identify similar and/or identical elements.

DETAILED DESCRIPTION

In typical micro-LED displays with touch-screens, a touch panel is integrated onto a micro-LED display, which diminishes the advantage of the thinness of the micro-LED display. Instead, the present disclosure provides a micro-LED display with sensors such as touch and light sensors integrated into the pixels of micro-LED display. Since a layer of a touch panel is not added onto the micro-LED display, the micro-LED display of the present disclosure is thin.

In the micro-LED display of the present disclosure, the touch and light sensors are embedded as subpixels into the pixels comprising RGB subpixels. For example, touch sensors such as capacitive sensors, or photo-resistors and photodiodes that can sense both touch and ambient light, are integrated into the RGB pixels in the same plane as the RGB subpixels. Accordingly, the thickness of the micro-LED display panel remains the same. Additionally, in the micro-LED display of the present disclosure, since a layer of a touch panel is not added onto the micro-LED display, there is no multi-layer reflection that reduces optical efficiency of the micro-LED display.

In the micro-LED display of the present disclosure, each pixel includes micro-LEDs of primary colors (RGB) and a subpixel of a touch/light sensor. Accordingly, the sensors embedded in the micro-LEDs are called pixelated sensors. Examples of the pixelated touch/light sensors include capacitive sensors, photo-resistors, and photodiodes. In addition to sensing proximity and touch, with pixelated ambient light sensing, graphics displayed on the micro-LED display can be optimized (e.g., gamma curve adjustment can be performed) based on the ambient light. Further, both capacitive and photo-resistor based approaches can be used for proximity touch sensing and driver behavior monitoring in vehicles. These and other features of the present disclosure are described below in detail.

Figure 1A:
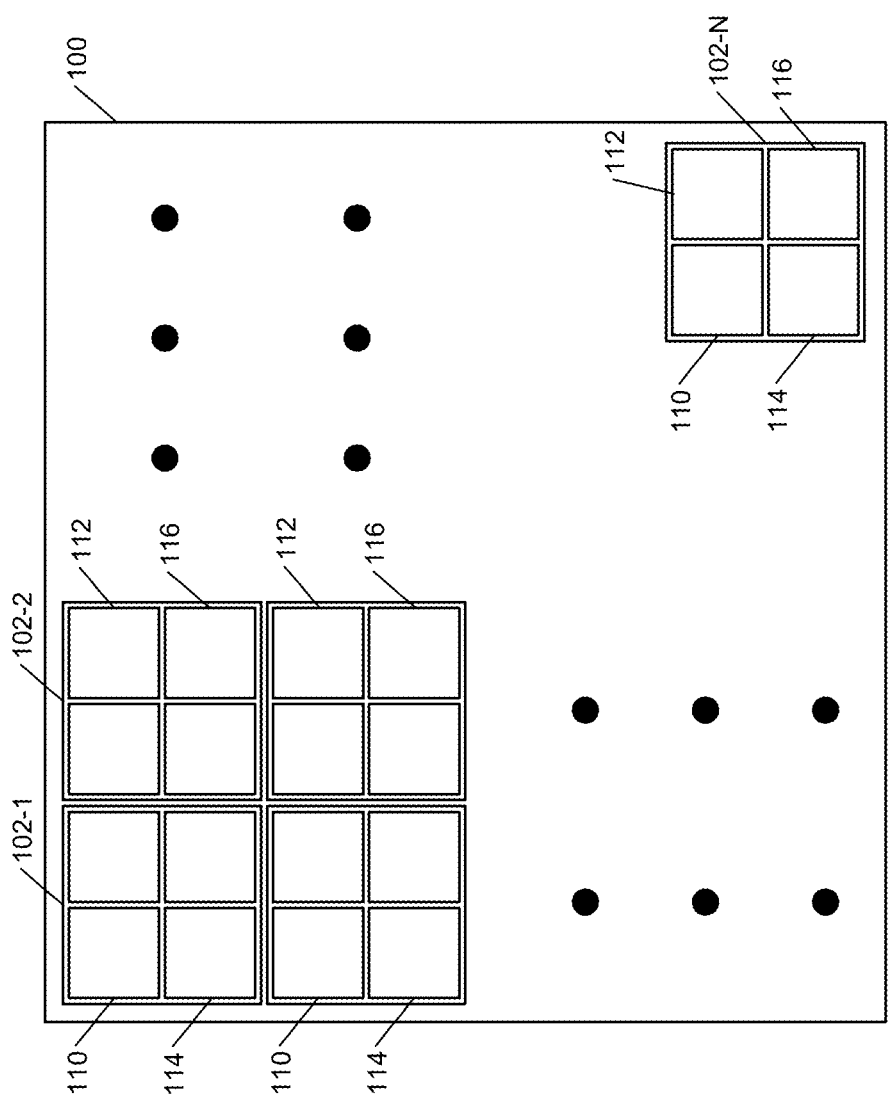
FIGS. 1A and 1B show examples of micro-LED displays with sensors embedded into (i.e., integrated with) micro-LEDs of the micro-LED displays according to the present disclosure.
Figure 1B:
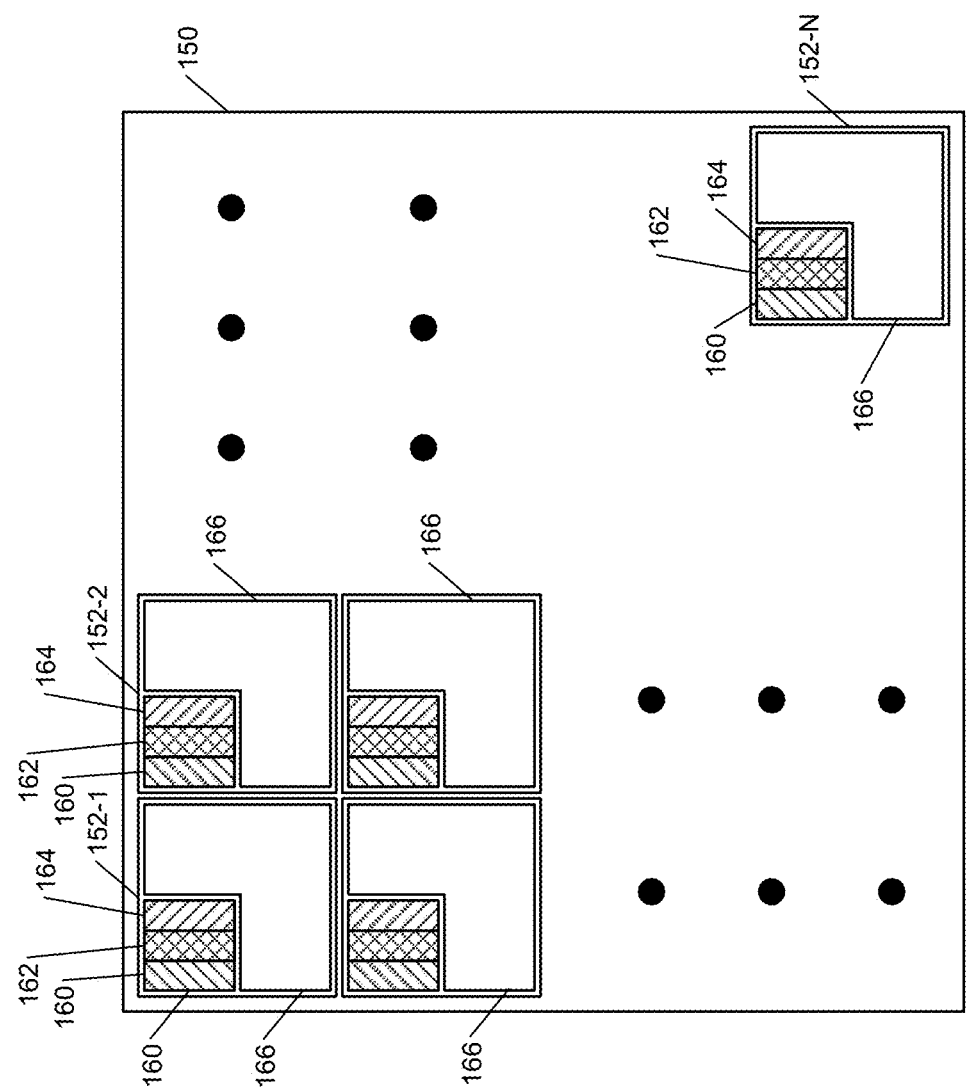

FIGS. 1A and 1B respectively show examples of non-transparent and transparent micro-LED displays with pixelated sensors according to the present disclosure. The sensor subpixels and dielectric front panel of the micro-LED displays are transparent. In non-transparent displays shown in FIG. 1A, the size of the sensor subpixels is the same as that of the RGB primary color pixels. The size of the transparent area of the non-transparent display is not sufficient for a viewer to see-through the display. In transparent displays shown in FIG. 1B, the size of the sensor subpixels is large enough for a viewer to see-through the display.

In FIG. 1A, a micro-LED display 100 includes sets of micro-LEDs 102-1, 102-2, . . . , and 102-N, where N is an integer greater than 1 (collectively micro-LEDs 102) arranged in rows and columns. Each micro-LED 102 includes a red LED 110, a green LED 112, and a blue LED 114 (collectively RGB LEDs 110, 112, 114). In addition, a sensor 116 is integrated with (i.e., embedded in) each micro-LED 102. The micro-LED 102 including the sensor 116 forms a pixel of the micro-LED display 100. Accordingly, the RGB LEDs 110, 112, 114 and the sensor 116 are pixelated.

While each micro-LED 102 is shown to include the sensor 116, in some implementations, the sensor 116 may be included in some of the micro-LEDs 102. For example, the sensor 116 may be included in alternate ones of the micro-LEDs 102. Various other regular or irregular patterns may be used.

Figure 5:
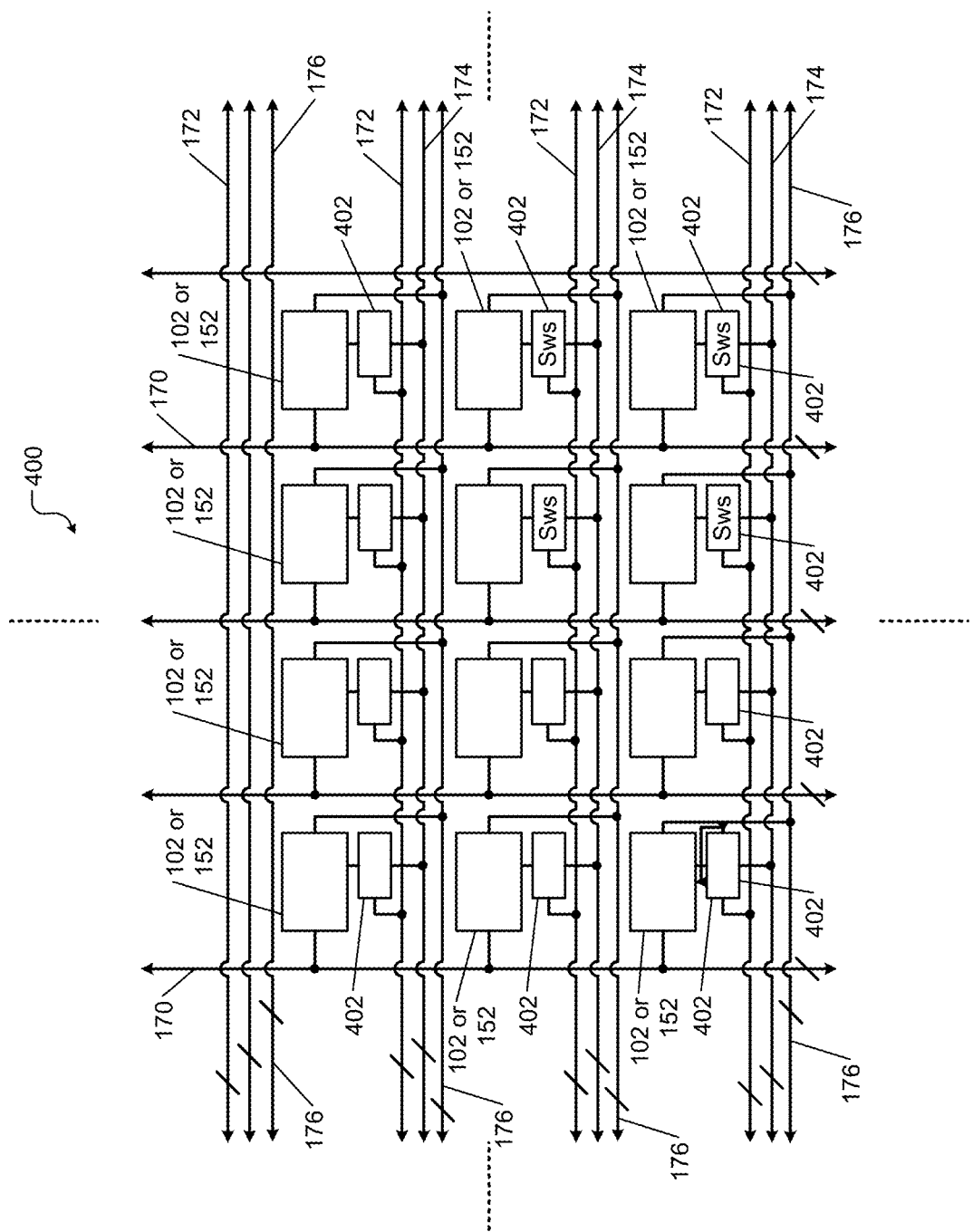
FIG. 5 shows an array of the micro-LEDs of the micro-LED displays of FIGS. 1A and 1B according to the present disclosure.

The RGB LEDs 110, 112, 114 and the sensor 116 are arranged in the same plane (level) in each micro-LED 102. That is, in each micro-LED 102, the RGB LEDs 110, 112, 114 are arranged in a plane, and the sensor 116 is arranged in the same plane in which the RGB LEDs 110, 112, 114 are arranged. An example of an array comprising the sets of micro-LEDs 102 is shown in FIG. 5.

The sensor 116 and the RGB LEDs 110, 112, 114 may be arranged in any order other than that shown. For example, in different pixels, the sensor 116 may be located in a different quadrant. That is, the quadrant in which the sensor 116 is located may differ from pixel to pixel. In each pixel, the ratio of the area of a pixel covered by the sensor 116 to the area of the pixel covered by the RGB LEDs 110, 112, 114 may be 1:3. For example, in each pixel, the area covered by each of the RGB LEDs 110, 112, 114 and the sensor 116 may be equal. As shown in subsequent drawings, the display 100 is manufactured by arranging a layer of the micro-LEDs 102, which includes the sensors 116, on a substrate, and a cover of a dielectric material is disposed on the layer of the micro-LEDs 102.

In FIG. 1B, a micro-LED display 150 includes sets of micro-LEDs 152-1, 152-2, . . . , and 152-N, where N is an integer greater than 1 (collectively micro-LEDs 152) arranged in rows and columns. Each micro-LED 152 includes a red LED 160, a green LED 162, and a blue LED 164 (collectively RGB LEDs 160, 162, 164). In addition, a sensor 166 is integrated with (i.e., embedded in) each micro-LED 152. The micro-LED 152 including the sensor 166 forms a pixel of the micro-LED display 150. Accordingly, the RGB LEDs 160, 162, 164 and the sensor 166 are pixelated.

Again, while each micro-LED 152 is shown to include the sensor 166, in some implementations, the sensor 166 may be included in some of the micro-LEDs 152. For example, the sensor 166 may be included in alternate ones of the micro-LEDs 152. Various other regular or irregular patterns may be used.

The RGB LEDs 160, 162, 164 and the sensor 166 are arranged in the same plane (level) in each micro-LED 152. That is, in each micro-LED 152, the RGB LEDs 160, 162, 164 are arranged in a plane, and the sensor 166 is arranged in the same plane in which the RGB LEDs 160, 162, 164 are arranged. An example of an array comprising the sets of micro-LEDs 152 is shown in FIG. 5.

The orientation of the sensor 166 relative to the RGB LEDs 160, 162, 164 may be different than that shown. For example, in different pixels, the RGB LEDs 160, 162, 164 may be located in a different quadrant. That is, the quadrant in which the RGB LEDs 160, 162, 164 are located may differ from pixel to pixel. The orientation may be different in different pixels (i.e., may differ from pixel to pixel). Alternatively, the RGB LEDs 160, 162, 164 may be located at the center of the pixel, and the sensor 166 may surround the RGB LEDs 160, 162, 164.

In each pixel, the ratio of the area of a pixel covered by the sensor 166 to the area of the pixel covered by the RGB LEDs 160, 162, 164 may be 3:1. As shown in subsequent drawings, the display 150 is manufactured by arranging a layer of the micro-LEDs 152, which includes the sensors 166, on a substrate, and a cover of a dielectric material is disposed on the layer of the micro-LEDs 152.

FIGS. 2A-2C show an example of a pixelated capacitive touch sensor according to the present disclosure. The capacitive touch sensor also senses proximity of an object such as a finger to the display as explained below. FIG. 2A shows a side cross-section of a portion of a display such as the display 100 or 150 shown in FIGS. 1A and 1B. FIGS. 2B and 2C show a manner of sensing touch (or proximity) using the sensor 116 or 166.

In FIG. 2A, the display 100 or 150 comprises a substrate 200. The micro-LEDs 102 or 152, which include the sensors 116 or 166, are arranged on the substrate 200. A cover 204 of a dielectric material covers the micro-LEDs 102 or 152. The cover 204 may also be called a dielectric front panel (as shown in FIG. 2C). For example, the sensor 116 or 166 is a capacitive sensor that includes an electrode for sensing proximity or touch.

In FIG. 2C, a controller 500 (shown in detail in FIG. 6) senses a capacitance of the sensor 116 (or 166). For example, a sampling capacitor 210 is connected to the controller 500 and to the electrode of the sensor 116 (or 166). The sampling capacitor 210 and the capacitance of the sensor 116 (or 166) are effectively connected in parallel to each other. The sensor 116 (or 166) has a first capacitance when there is no object proximate to the sensor 116 (or 166). The sensor 116 (or 166) has a second capacitance when an object such as a finger approaches and touches (i.e., is in contact with) a portion of the cover 204 adjacent to the sensor 116 (or 166).

The capacitance of the sensor 116 (or 166) changes between the first capacitance and the second capacitance when an object such as a finger approaches the cover 204 as shown in FIG. 2B. The change is capacitance of the sensor 116 (or 166) is sensed by the controller 500. The proximity or distance of the object to the cover 204 is proportional to the change in the capacitance of the sensor 116 (or 166). The controller 500 senses the change in the capacitance of the sensor 116 (or 166) and detects the proximity (or contact) of the object to the cover 204.

Figure 3B:
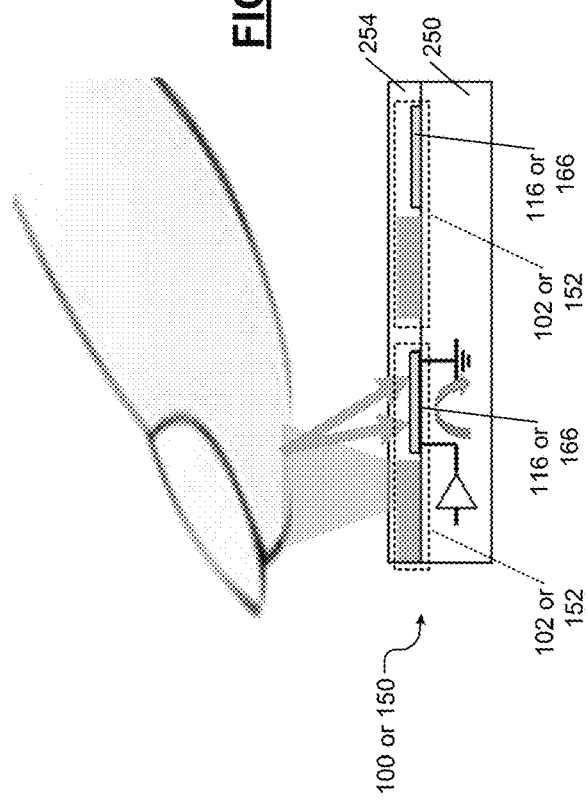
FIGS. 3A-3D show an example of a photo-resistive sensor embedded in the micro-LEDs of the micro-LED displays of FIGS. 1A and 1B according to the present disclosure.
Figure 3C:
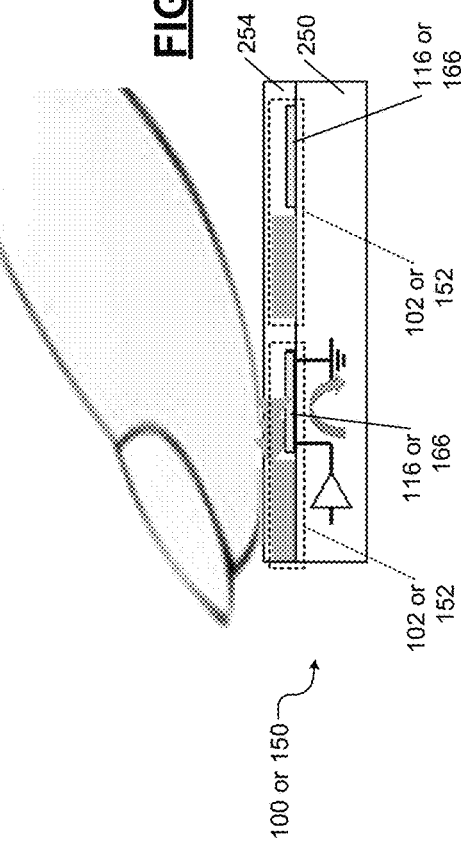
Figure 3A:
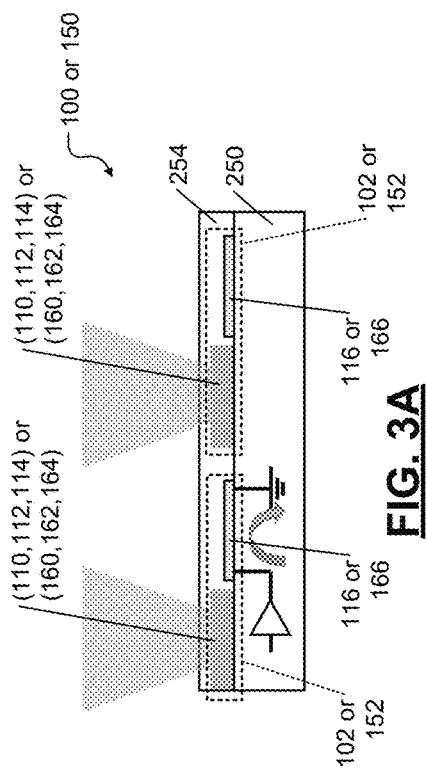
Figure 3D:
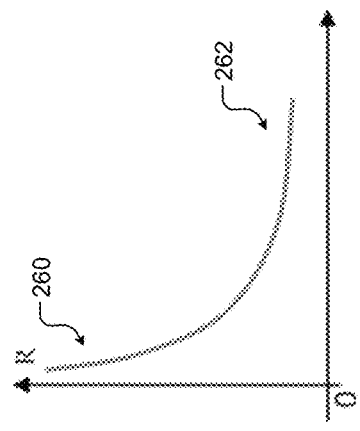

FIGS. 3A-3D show an example of a pixelated photo-resistive sensor according to the present disclosure. The photo-resistive sensor senses proximity and touch of an object such as a finger to the display as explained below. Additionally, the photo-resistive sensor senses ambient light as explained below. FIG. 3A shows a side cross-section of a portion of a display such as the display 100 or 150 shown in FIGS. 1A and 1B. FIGS. 3B-3D show a manner of sensing touch (or proximity) and ambient light using the sensor 116 or 166.

In FIG. 3A, the display 100 or 150 comprises a substrate 250. The micro-LEDs 102 or 152, which include the sensors 116 or 166, are arranged on the substrate 250. A cover 254 of a dielectric material covers the micro-LEDs 102 or 152. For example, the sensor 116 or 166 is a photo-resistor.

The controller 500 (shown in FIG. 6) senses a current through the sensor 116 (or 166). The display 100 and 150 is optically designed such that light emitted by the RGB LEDs (110, 112, 114) or (160, 162, 164) does not interact with the sensors 116 (or 166) normally (i.e., when no object is proximate to the sensors 116 or 166). The sensor 116 (or 166) has a first resistance (shown at 260 in FIG. 3D) when there is no object proximate to the sensor 116 (or 166). The sensor 116 (or 166) has a second resistance (shown at 262 in FIG. 3D) when an object such as a finger touches (i.e., is in contact with) a portion of the cover 254 adjacent to the sensor 116 (or 166) and some of the light emitted by the RGB LEDs is incident on the sensor 116 (or 166) as shown in FIG. 3C.

The resistance of the sensor 116 (or 166) changes between the first resistance 260 and the second resistance 262 as shown in FIG. 3D when an object such as a finger approaches the cover 254, scatters the light from the RGB LEDs, and illuminates the sensor 116 (or 166) as shown in FIG. 3B. The change in the resistance of the sensor 116 (or 166) is sensed by the controller 500. The proximity or distance of the object to the cover 254 is proportional to the change in the resistance of the sensor 116 (or 166). The controller 500 senses the change in the resistance of the sensor 116 (or 166) and detects the proximity (or contact) of the object to the cover 254.

Ambient light can also change the resistance of the photo-resistors used as the sensors 116 or 166. However, while an object approaching the display to touch the display will change the resistance of only a few of the sensors 116 or 166, a change in ambient light will change the resistance of more than a few (e.g., all) of the sensors 116 or 166. A threshold number of sensors that may be sufficient to detect proximity or contact (touch) of an object can be empirically predetermined. When resistance of a number of sensors greater than the threshold number of sensors, the change in the resistance can be inferred as due to a change in ambient light. When the controller 500 detects the change in resistance of more than a few (e.g., all) of the sensors 116 or 166, the controller 500 can adjust the intensity of the RGB LEDs proportional to the change in resistance of all of the sensors 116 or 166.

FIGS. 4A-4D show an example of a pixelated photodiode sensor according to the present disclosure. The photodiode sensor senses proximity and touch of an object such as a finger to the display as explained below. Additionally, the photodiode sensor senses ambient light as explained below. FIG. 4A shows a side cross-section of a portion of a display such as the display 100 or 150 shown in FIGS. 1A and 1B. FIGS. 4B-4D show a manner of sensing touch (or proximity) using the sensor 116 or 166.

In FIG. 4A, the display 100 or 150 comprises a substrate 300. The micro-LEDs 102 or 152, which include the sensors 116 or 166, are arranged on the substrate 300. A cover 304 of a dielectric material covers the micro-LEDs 102 or 152. For example, the sensor 116 or 166 is a photodiode.

The controller 500 (shown in FIG. 6) senses a current through the sensor 116 (or 166). The display 100 and 150 is optically designed such that light emitted by the RGB LEDs does not interact with the sensors 116 (or 166) normally (i.e., when no object is proximate to the sensors 116 or 166). The current through the photodiode in the sensor 116 (or 166) changes as the intensity of light incident on the photodiode changes as shown in FIG. 4D.

The intensity of light incident on the photodiode changes as an object such as a finger approaches and touches (i.e., contacts) a portion of the cover 304 adjacent to the sensor 116 (or 166) since some of the light emitted by the RGB LEDs is scattered by the approaching object and is incident on the sensor 116 (or 166) as shown in FIG. 4C. Accordingly, current through the sensor 116 (or 166) changes when an object such as a finger approaches the cover 304, scatters the light from the RGB LEDs, and illuminates the sensor 116 (or 166) as shown in FIG. 4D. The change in current through the sensor 116 (or 166) is sensed by the controller 500. The proximity or distance of the object to the cover 304 is proportional to the change in current through the sensor 116 (or 166). The controller 500 senses the change in the current through the sensor 116 (or 166) and detects the proximity (or contact) of the object to the cover 304.

Ambient light can also change the current through the photodiodes used as the sensors 116 or 166. While an AC portion of the signal received from the sensors 116 or 166 indicates the light incident from the RGB LEDs on the sensors 116 or 166, a DC portion of the signal received from the sensors 116 or 166 indicates ambient light incident on the sensors 116 or 166. In other words, ambient light causes a DC shift in the current characteristics of the sensors 116 or 166, which can be detected by the controller 500. Accordingly, the controller 500 can detect proximity or touch based on the AC portion of the signal received from the sensors 116 or 166 and can detect intensity of ambient light based on DC portion of the signal received from the sensors 116 or 166. The controller 500 can adjust the intensity of the RGB LEDs (110, 112, 114) or (160, 162, 164) proportional to the DC portion of the signal received from the sensors 116 or 166.

FIG. 5 shows an array 400 comprising the micro-LEDs 102 or 152. For example, the display 100, 150 comprises the array 400. The array 400 is manufactured on a substrate (e.g., element 200, 250, or 300 shown in FIGS. 2A-4D). A cover (e.g., element 204, 254, or 304 shown in FIGS. 2A-4D) covers the array 400. The RGB LEDs (110, 112, 114) or (160, 162, 164) and the sensors 116, 166 in each of the micro-LEDs 102 or 152 are not shown as separate elements in FIG. 5 but are shown as separate elements in FIG. 6.

The array 400 comprises a plurality of sets of switches (shown as Sws) 402 connected to the micro-LEDs 102, 152 (i.e., to the RGB LEDs (110, 112, 114) or (160, 162, 164)). Each set of switches 402 is connected a respective set of micro-LEDs 102, 152. Each set of switches 402 includes three switches (shown in FIG. 6) that are respectively connected to the individual RGB LEDs in the micro-LEDs 102, 152 (i.e., to the RGB LEDs (110, 112, 114) or (160, 162, 164)). Again, the three switches in the sets of switches 402 are not shown as separate elements in FIG. 5 but are shown as separate elements in FIG. 6.

The array 400 further comprises a plurality of power supply lines 170, a plurality of power return lines 172, and a plurality of control lines 174. For Example, the power supply lines 170 may be connected to first ends of the RGB LEDs (110, 112, 114) or (160, 162, 164) in each of the micro-LEDs 102, 152. The power return lines 172 may be connected to second ends of the RGB LEDs (110, 112, 114) or (160, 162, 164) in each of the micro-LEDs 102, 152 via respective switches 402. The control lines 174 may be connected to control terminals of the switches 402 (e.g., to gates of transistors used as switches 402). As described below with reference to FIG. 6, the controller 500 can control the switches 402 and selectively turn on and off any of the RGB LEDs (110, 112, 114) or (160, 162, 164) in each of the micro-LEDs 102, 152 in the micro-LED array 400.

The array 400 further comprises a plurality of sensor lines 176 connected to the sensors 116, 166. The controller 500 is connected to the sensors 116, 166 via the sensor lines 176. The controller 500 receives signals from the sensors 116, 166 via the sensor lines 176.

Figure 6:
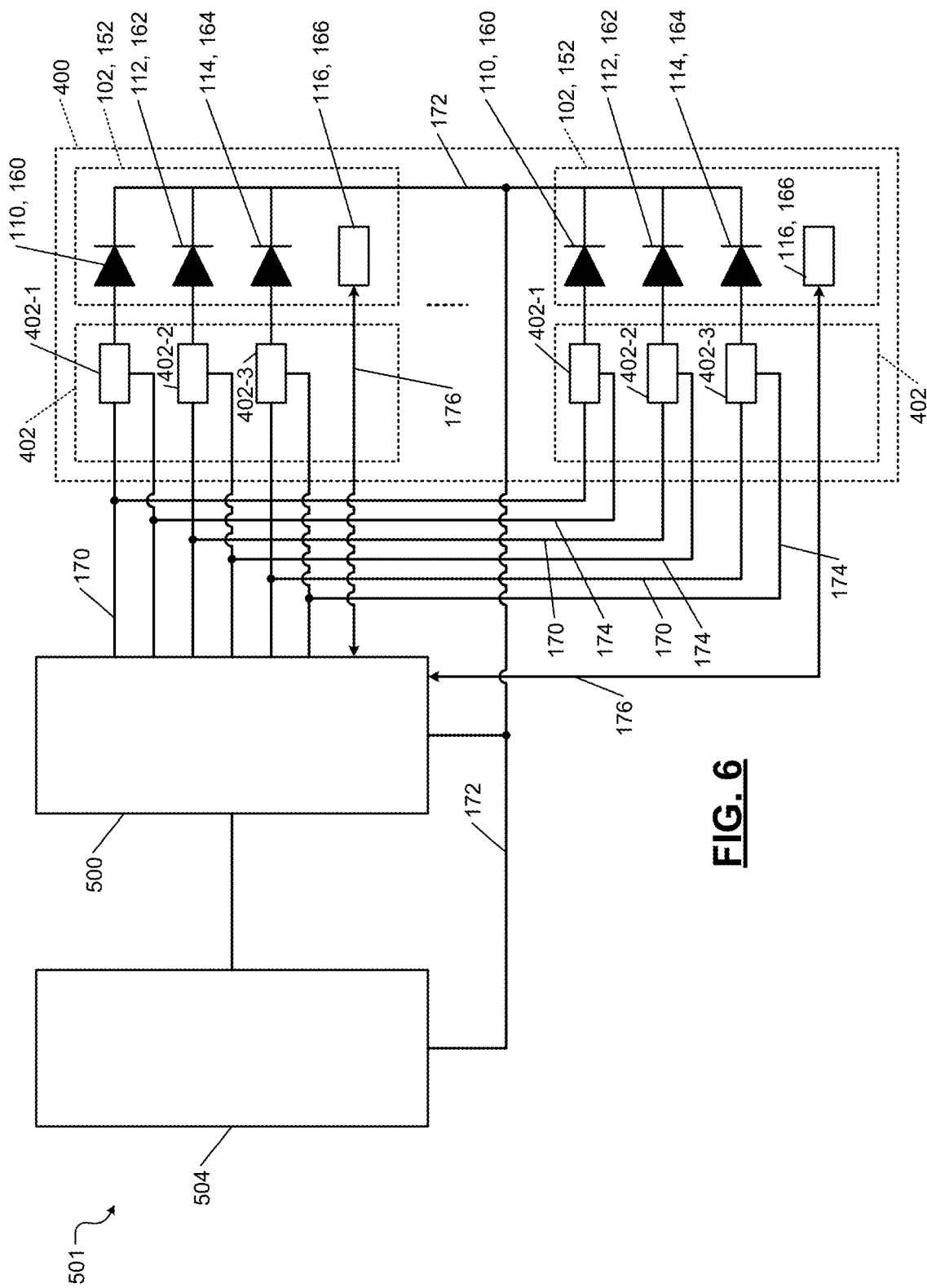
FIG. 6 shows a system comprising the array of FIG. 5, a controller, and a power supply according to the present disclosure.

FIG. 6 shows a block diagram of a system 501 comprising the array 400, the controller 500, and a power supply (e.g., a battery of a vehicle) 504. Each set of switches 402 includes three switches 402-1, 402-2, 402-3, (collectively the switches 402). The sensors 116, 166 are shown as elements "S."

The controller 500 can sense the proximity or touch of an object (e.g., a finger) to the cover (e.g., elements 204, 254, 304 shown in FIGS. 2A-4D) of the display 100, 150 based on the signals received from one or more of the sensors 116, 166 as described above with reference to FIGS. 2A-4D.

Additionally, the controller 500 can detect the intensity of ambient light based on the signals received from one or more of the sensors 116, 166 as described above with reference to FIGS. 3A-4D. Based on the detected intensity of the ambient light, the controller 500 can adjust the luminance (i.e., intensity) of the RGB LEDs (110, 112, 114) or (160, 162, 164) in the micro-LEDs 102, 152 in the array 400.

In addition, the controller 500 can adjust the gamma curve of graphics displayed on the display 100, 150. Based on the detected intensity of the ambient light, the controller 500 can determine ambient light distribution across the array 400 and can adjust the gamma curve at pixel level based on ambient light distribution across the array 400.

Figure 7C:
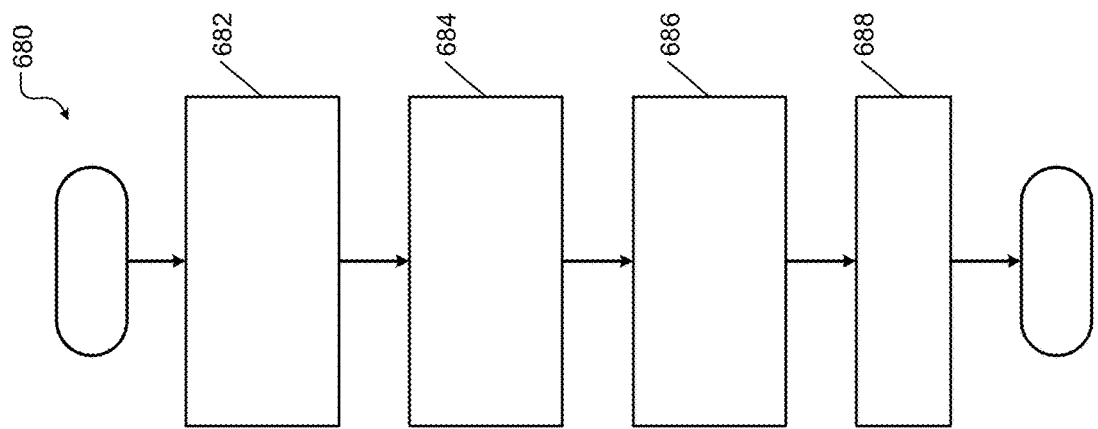
FIGS. 7A-7C show flowcharts of various methods performed by the controller of FIG. 6 according to the present disclosure.
Figure 7B:
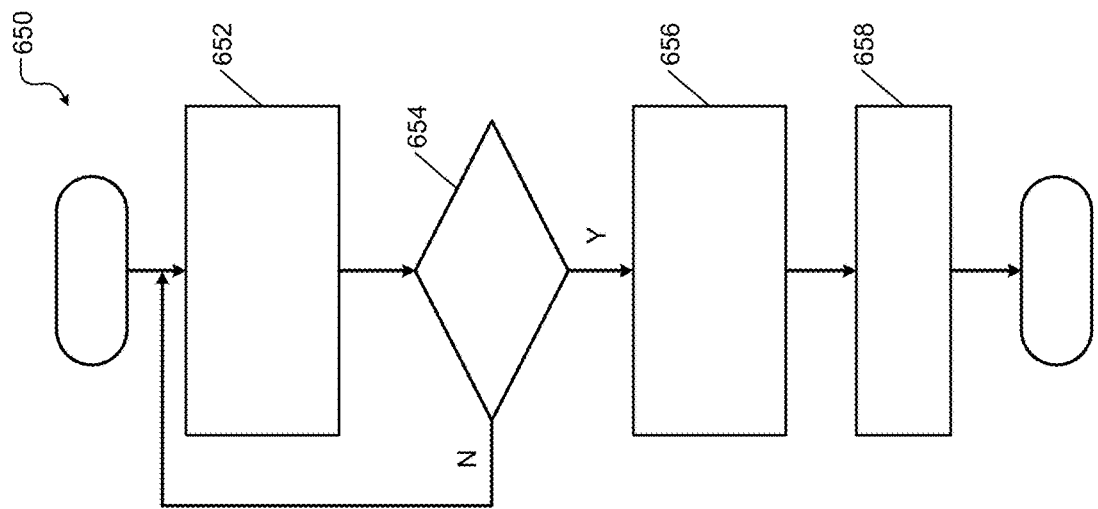
Figure 7A:
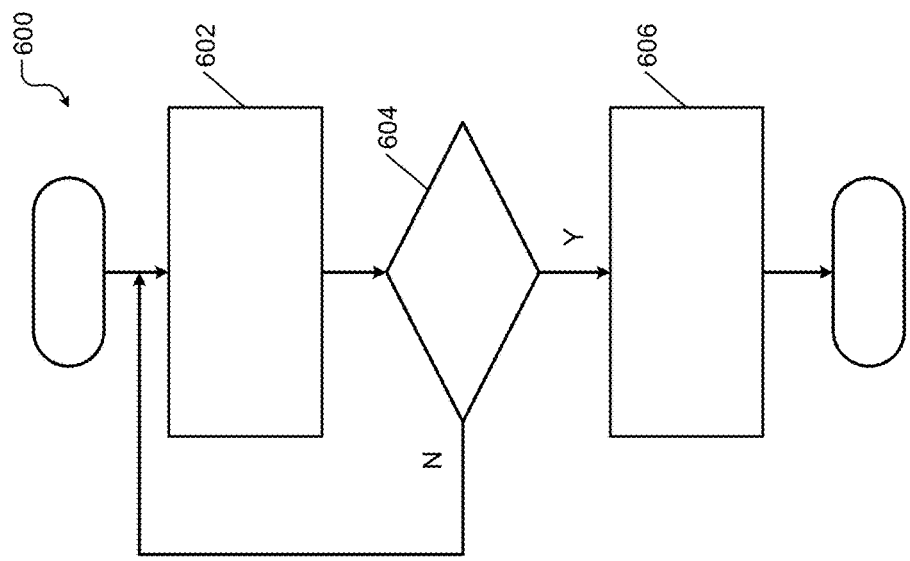

FIGS. 7A-7C show flowcharts of various methods performed by the controller 500. In the following description, the term control refers to the operations performed by the controller 500.

FIG. 7A shows a method 600 for detecting proximity and contact using a capacitive, photo-resistive, or photodiode sensor integrated into RGB micro-LEDs according to the present disclosure. At 602, control monitors a parameter such as capacitance of a capacitive sensor, resistance of a photo-resistive sensor, or current through a photodiode, as described above with reference to FIGS. 2A-6.

At 604, control determines if the parameter changed due to an object (e.g., finger) being proximate to or in contact with (i.e., touching) the display. Control returns to 602 if the parameter does not change. If the parameter changed, at 606, control detects proximity or contact of the object with the display based on the sensed change in the parameter.

FIG. 7B shows a method 650 for detecting a change in ambient light using a photo-resistive sensor integrated into RGB micro-LEDs and adjusting intensity of the RGB micro-LEDs according to the present disclosure. At 652, control monitors a parameter such as resistance of the photo-resistive sensor as described above with reference to FIGS. 3A-3D and 5-6.

At 654, control determines if the parameter changed due to a change in intensity of ambient light. Control returns to 652 if the parameter does not change (i.e., there is no change in intensity of ambient light). If the parameter changed, at 656, control detects a change in intensity of ambient light based on the sensed change in the parameter. At 658, control adjusts the intensity of the RGB micro-LEDs based on the sensed change in the intensity of ambient light.

FIG. 7C shows a method 680 for detecting proximity/ contact and intensity of ambient light using a photodiode sensor integrated into RGB micro-LEDs according to the present disclosure. At 682, control monitors a parameter such as current through the photodiode as described above with reference to FIGS. 4A-6.

At 684, control detects proximity or contact of an object (e.g., finger) with the display based on an AC portion of the sensed parameter. At 686, control detects a change in intensity of ambient light based on a DC portion of the sensed parameter. At 688, control adjusts the intensity of the RGB micro-LEDs based on the sensed change in the intensity of ambient light.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "controller" may be replaced with the term "circuit." The term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term code, as used above, may include software, firmware, and/or microcode, and may refer to programs, routines, functions, classes, data structures, and/or objects. The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A display comprising:
    a substrate;
    sets of light emitting diodes (LEDs) arranged on the substrate, each of the sets of LEDs comprising a red LED, a green LED, a blue LED, and each of the sets of LEDs forming a pixel of the display;
    a sensor embedded in each of the sets of LEDs, the sensor arranged in a plane in which the red, green, and blue LEDs are arranged in each of the sets of LEDs; and
    a cover comprising a dielectric material covering the sets of LEDs and the sensor, the cover being disposed directly on the sets of LEDs and the sensor,
    wherein the sensor is configured to sense an ambient light and proximity of an object directly above the cover.

2. The display of claim 1 wherein the sensor is configured to sense contact between the object and the cover.

3. The display of claim 1 wherein the sensor includes a capacitive sensor.

4. The display of claim 1 wherein the sensor includes a photo-resistor.

5. The display of claim 1 wherein the sensor includes a photo diode.

6. The display of claim 1 wherein in each pixel of the display, an area covered by the sensor is the same as an area covered by each of the red, green, and blue LEDs.

7. The display of claim 1 wherein in each pixel of the display, an area covered by the sensor is more than 3 times larger than an area covered by the red, green, and blue LEDs.

8. A system comprising:
the display of claim 1; and
a controller configured to:
control the sets of LEDs; and
detect, based on an input received from the sensor, the ambient light and proximity of the object directly above the cover.

9. A system comprising:
the display of claim 1, wherein the sensor includes a photodiode; and
a controller configured to:
control the sets of LEDs; and
detect the proximity of the object to the cover based on an AC portion of an input received from the sensor; and
detect the ambient light based on a DC portion of the input received from the sensor.

10. A system comprising:
the display of claim 1; and
a controller configured to:
detect, based on an input received from the sensor, the at least one of ambient light and proximity of the object to the cover; and
control one or more of the sets of LEDs based on the detected ambient light and proximity of the object directly above the cover.

11. A method comprising:
arranging sets of light emitting diodes (LEDs) on a substrate, each of the sets of LEDs comprising a red LED, a green LED, a blue LED, and each of the sets of LEDs forming a pixel of a display;
integrating a sensor in each of the sets of LEDs, the sensor being arranged in a plane in which the red, green, and blue LEDs are arranged in each of the sets of LEDs;
covering the sets of LEDs and the sensor by disposing a cover comprising a dielectric material directly on the sets of LEDs and the sensor; and
sensing using the sensor an ambient light and proximity of an object is directly above the cover.

12. The method of claim 11 further comprising sensing using the sensor contact between the object and the cover.

13. The method of claim 11 wherein the sensor includes a capacitive sensor.

14. The method of claim 11 wherein the sensor includes a photo-resistor.

15. The method of claim 11 wherein the sensor includes a photo diode.

16. The method of claim 11 wherein in each pixel of the display, an area covered by the sensor is the same as an area covered by each of the red, green, and blue LEDs.

17. The method of claim 11 wherein in each pixel of the display, an area covered by the sensor is more than 3 times larger than an area covered by the red, green, and blue LEDs.

18. The method of claim 11 further comprising:
detecting, based on an input received from the sensor, the at least one of ambient light and proximity of the object to the cover; and
controlling one or more of the sets of LEDs based on the detected ambient light and proximity of the object directly above the cover.

19. The method of claim 11 wherein the sensor includes a photodiode, the method further comprising:
detecting the proximity of the object to the cover based on an AC portion of an input received from the sensor;
detecting intensity of the ambient light based on a DC portion of the input received from the sensor; and
controlling the sets of LEDS based on the detected proximity of the object directly above the cover and the detected intensity of the ambient light.

\* \* \* \* \*